United States Patent
Hirai

(10) Patent No.: US 9,553,718 B2
(45) Date of Patent: Jan. 24, 2017

(54) PLL CIRCUIT AND CONTROL METHOD THEREOF

(71) Applicant: Renesas Electronics Corporation, Tokyo (JP)

(72) Inventor: Yoshitaka Hirai, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/960,952

(22) Filed: Dec. 7, 2015

(65) Prior Publication Data

US 2016/0248579 A1 Aug. 25, 2016

(30) Foreign Application Priority Data

Feb. 19, 2015 (JP) ................................. 2015-030303

(51) Int. Cl.
*H03D 3/24* (2006.01)
*H04L 7/033* (2006.01)

(52) U.S. Cl.
CPC ..................................... *H04L 7/0331* (2013.01)

(58) Field of Classification Search
CPC ...... H03L 7/0891; H03L 7/089; H03L 7/1072; H03L 7/06; H03L 7/22; H04B 1/7174
USPC ....... 327/156, 157, 147, 148, 291, 101, 244; 375/376, 374, 373, 371
See application file for complete search history.

(56) References Cited

U.S. PATENT DOCUMENTS

| 7,511,543 B2 | 3/2009 | Friedman et al. |
| 2012/0154000 A1* | 6/2012 | Tabata .................... H03L 7/089 327/157 |

* cited by examiner

*Primary Examiner* — Rahel Guarino
(74) *Attorney, Agent, or Firm* — Sughrue Mion, PLLC

(57) ABSTRACT

According to one embodiment, a PLL circuit includes: a phase comparator (13); a pulse width control unit that adjusts a pulse width of comparison results (UP, DN) of the phase comparator (13) and outputs comparison results (UPi, DNi) having a pulse width smaller than that of comparison results (UPp, DNp); a charge pump (14) that outputs a current (Ip) according to the comparison results (UPp, DNp); a charge pump (15) that outputs a current (Ii) according to the comparison results (UPi, DNi); a filter (16) that removes a high-frequency component of a voltage generated based on the current (Ip) and outputs a control voltage (Vp); a filter (17) that outputs, as a control voltage (Vi), a result obtained by integrating the current (Ii); and a voltage control oscillator (18) that generates an oscillating signal having a frequency according to the control voltage (Vp, Vi).

8 Claims, 15 Drawing Sheets

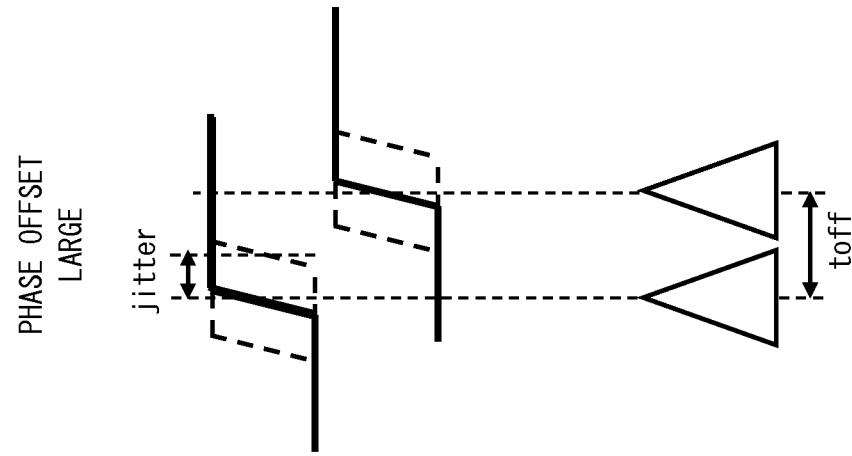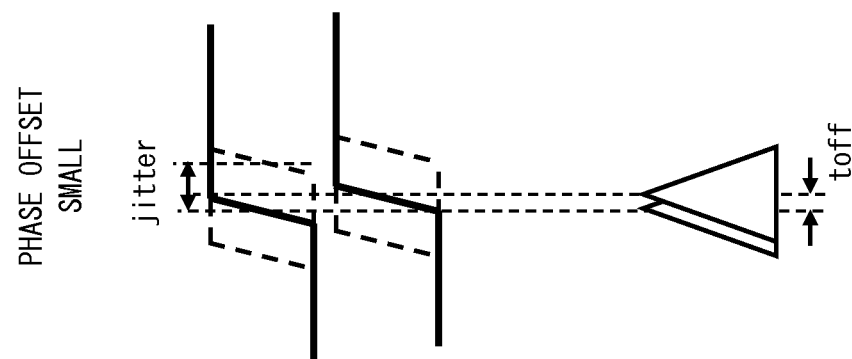
Fig. 13

PLL CIRCUIT AND CONTROL METHOD THEREOF

CROSS-REFERENCE TO RELATED APPLICATIONS

This application is based upon and claims the benefit of priority from Japanese patent application No. 2015-030303, filed on Feb. 19, 2015, the disclosure of which is incorporated herein in its entirety by reference.

BACKGROUND

The present invention relates to a PLL circuit and a control method thereof. For example, the present invention relates to a PLL circuit suitable for generating an oscillating signal with a high accuracy by reducing a phase offset, and a control method thereof.

PLL (Phase Locked Loop) circuits are mounted as oscillating circuits on various semiconductor devices. A PLL circuit is a circuit that controls the frequency of an output signal so that the phase of a reference signal and the phase of the output signal match each other.

In the PLL circuit, a phase offset may occur due to variations in the current that flows when a charge switch and a discharge switch, which constitute a charge pump, are turned on. The term "phase offset" used herein refers to a steady phase difference between the reference signal and the output signal when the PLL circuit is locked.

A solution to this problem is disclosed in the specification of U.S. Pat. No. 7,511,543 B2. A PLL circuit disclosed in the specification of U.S. Pat. No. 7,511,543 B2 reduces a phase offset by adjusting an output current of a charge pump based on a difference in pulse width between a down signal and an up signal which are output from a replica of a phase comparator when the PLL circuit is locked.

SUMMARY

However, the configuration disclosed in the specification of U.S. Pat. No. 7,511,543 B2 has a problem that the phase offset cannot be effectively reduced due to the effect of relative variations between the phase comparator and the replica thereof. Other problems to be solved by and novel features of the present invention will become apparent from the following description and the accompanying drawings.

A first aspect of the present invention is a PLL circuit including: a phase comparator that compares a phase of a reference signal with a phase of a feedback signal and outputs a reference comparison result; a pulse width control unit that adjusts a pulse width of the reference comparison result, and outputs a first comparison result and a second comparison result having a pulse width smaller than that of the first comparison result; a first charge pump that outputs a first current according to the first comparison result; a second charge pump that outputs a second current according to the second comparison result; a first filter that removes a high-frequency component of a voltage generated based on the first current, and outputs a first control voltage; a second filter that outputs, as a second control voltage, a result obtained by integrating the second current; and an oscillator that generates an oscillating signal having a frequency according to the first and second control voltages, and feeds the oscillating signal back to the phase comparator as the feedback signal.

A second aspect of the present invention is a control method of a PLL circuit, including: comparing a phase of a reference signal with a phase of a feedback signal and outputting a reference comparison result; adjusting a pulse width of the reference comparison result and outputting a first comparison result and a second comparison result having a pulse width smaller than that of the first comparison result; outputting a first current according to the first comparison result; outputting a second current according to the second comparison result; removing a high-frequency component of a voltage generated based on the first current, and outputting a first control voltage; outputting, as a second control voltage, a result obtained by integrating the second current; and generating an oscillating signal having a frequency according to the first and second control voltages, and using the oscillating signal as the feedback signal.

According to the aspects of the invention, it is possible to provide a PLL circuit capable of generating an oscillating signal with a high accuracy by reducing a phase offset, and a control method thereof.

BRIEF DESCRIPTION OF THE DRAWINGS

The above and other aspects, advantages and features will be more apparent from the following description of certain embodiments taken in conjunction with the accompanying drawings, in which:

FIG. 13 is a diagram for explaining an operation of a phase difference measurement circuit provided in the PLL circuit shown in FIG. 12;

DETAILED DESCRIPTION

<Preliminary Review by the Present Inventor>

Details of the preliminary review by the present inventor will be described prior to the description of a PLL circuit 1 according to an embodiment of the invention.

Figure 14:
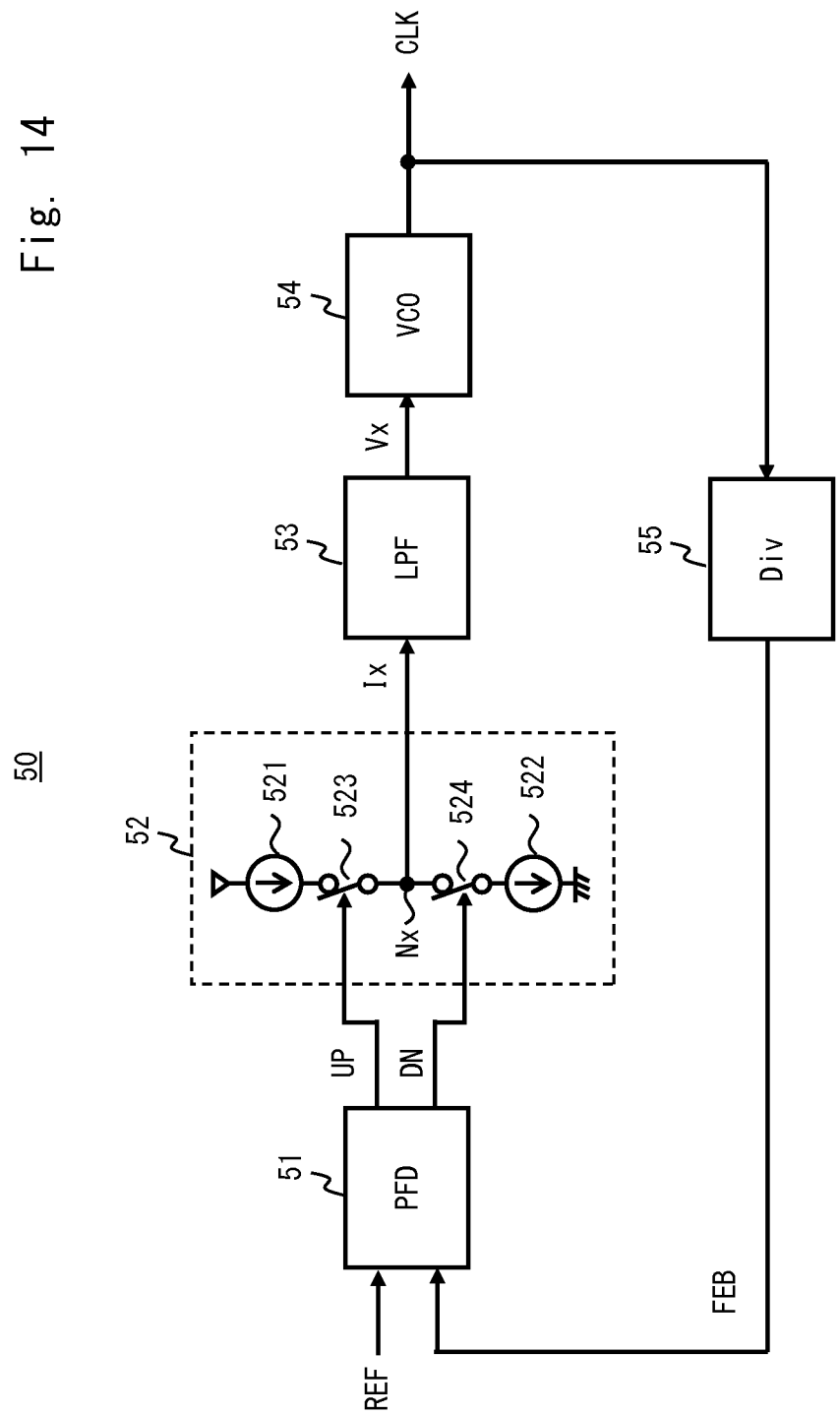
FIG. 14 is a block diagram showing a PLL circuit according to a concept before an embodiment of the invention is conceived.

FIG. 14 is a block diagram showing a PLL circuit 50 according to a concept before an embodiment of the invention is conceived.

As shown in FIG. 14, the PLL circuit 50 is a PLL circuit having a single loop configuration, and includes a phase comparator (PFD) 51, a charge pump (CP) 52, a low-pass filter (LPF) 53, a voltage control oscillator (VCO) 54, and a frequency divider (Div) 55.

The phase comparator 51 compares the phase of a reference signal REF with the phase of a feedback signal FEB, and outputs comparison results UP and DN. The comparison results UP and DN are pulse signals.

For example, when there is no phase difference between the reference signal REF and the feedback signal FEB, the phase comparator 51 outputs the comparison results UP and DN having the same pulse width. On the other hand, when there is a phase difference between the reference signal REF and the feedback signal FEB, the phase comparator 51 outputs the comparison results UP and DN having different pulse widths. More specifically, when the phase of the feedback signal FEB lags behind the phase of the reference signal REF, the pulse width of the comparison result UP is set to be longer by the phase difference than the pulse width of the comparison result DN. When the phase of the feedback signal FEB is ahead of the phase of the reference signal REF, the pulse width of the comparison result DN is set to be longer by the phase difference than the pulse width of the comparison result UP.

The charge pump 52 generates a current Ix according to the comparison results UP and DN of the phase comparator 51. The charge pump 52 includes, for example, constant current sources 521 and 522 and switches 523 and 524. The switches 523 and 524 are, for example, N-channel type MOS transistors.

The constant current source 521 is provided on the side of a power supply voltage terminal (hereinafter referred to as a "power supply voltage terminal VDD") which is supplied with a power supply voltage VDD. The switch 523 is provided between the constant current source 521 and an output node Nx, and turns on and off based on the comparison result UP. The constant current source 522 is provided on the side of a ground voltage terminal (hereinafter referred to as a "ground voltage terminal GND") which is provided with a ground voltage GND. The switch 524 is provided between the constant current source 522 and the output node Nx, and turns on and off based on the comparison result DN.

For example, when the pulse width of the comparison result UP and the pulse width of the comparison result DN are the same, the switches 523 and 524 turn on for the same period of time, and thus the charge pump 52 does not generate the current Ix. On the other hand, when the pulse width of the comparison result UP and the pulse width of the comparison result DN are different, the on-period of the switch 523 and the on-period of the switch 524 are different, and thus the charge pump 52 generates the current Ix. More specifically, when the pulse width of the comparison result UP is longer than the pulse width of the comparison result DN, the charge pump 52 accumulates the charge in the low-pass filter 53 during a period corresponding to the difference between the pulse widths (i.e., the phase difference). When the pulse width of the comparison result DN is longer than the pulse width of the comparison result UP, the charge pump 52 discharges the charge accumulated in the low-pass filter 53 for a period corresponding to the difference between the pulse widths (i.e., the phase difference).

The low-pass filter 53 generates a control voltage Vx by removing a high-frequency component of a voltage generated based on the current Ix output from the charge pump 52.

The voltage control oscillator 54 outputs an oscillating signal having a frequency corresponding to the control voltage Vx. For example, the voltage control oscillator 54 increases the frequency of the oscillating signal as the control voltage Vx increases, and the voltage control oscillator 54 decreases the frequency of the oscillating signal as the control voltage Vx decreases. This oscillating signal is output to the outside of the PLL circuit 50 as a clock signal CLK.

The frequency divider 19 divides the frequency of the oscillating signal, which is output from the voltage control oscillator 54, and outputs the frequency-divided signal as the feedback signal FEB.

For example, when the phase of the feedback signal FEB lags behind the phase of the reference signal REF, the PLL circuit 50 increases the oscillatory frequency of the voltage control oscillator 54, and when the phase of the feedback signal FEB is ahead of the phase of the reference signal REF, the PLL circuit 50 decreases the oscillatory frequency of the voltage control oscillator 54. Accordingly, the PLL circuit 50 matches the phases of the reference signal REF and the feedback signal FEB.

In this case, even when the phase of the reference signal REF and the phase of the feedback signal FEB match each other, the phase comparator 51 outputs the comparison results UP and DN having a predetermined width. At this time, the pulse width of each of the comparison results UP and DN is set to be equal to or greater than a minimum pulse width which can be detected by the subsequent-stage charge pump 52. On the other hand, when the phase of the reference signal REF and the phase of the feedback signal FEB do not match each other, the phase comparator 51 outputs one of the comparison results UP and DN having a pulse width obtained by adding a predetermined width to the phase difference between the reference signal REF and the feedback signal FEB, and outputs the other one of the comparison results UP and DN having a predetermined pulse width. The pulse width of the comparison results UP and DN when the phase of the reference signal REF and the phase of the feedback signal FEB match each other is hereinafter referred to as a "dead-zone preventing pulse width".

Thus, even when the phase difference between the reference signal REF and the feedback signal FEB is smaller than the minimum pulse width, the subsequent-stage charge pump 52 can operate normally by detecting the phase difference. This will be described in further detail below with reference to FIGS. 15 and 16.

Figure 15:
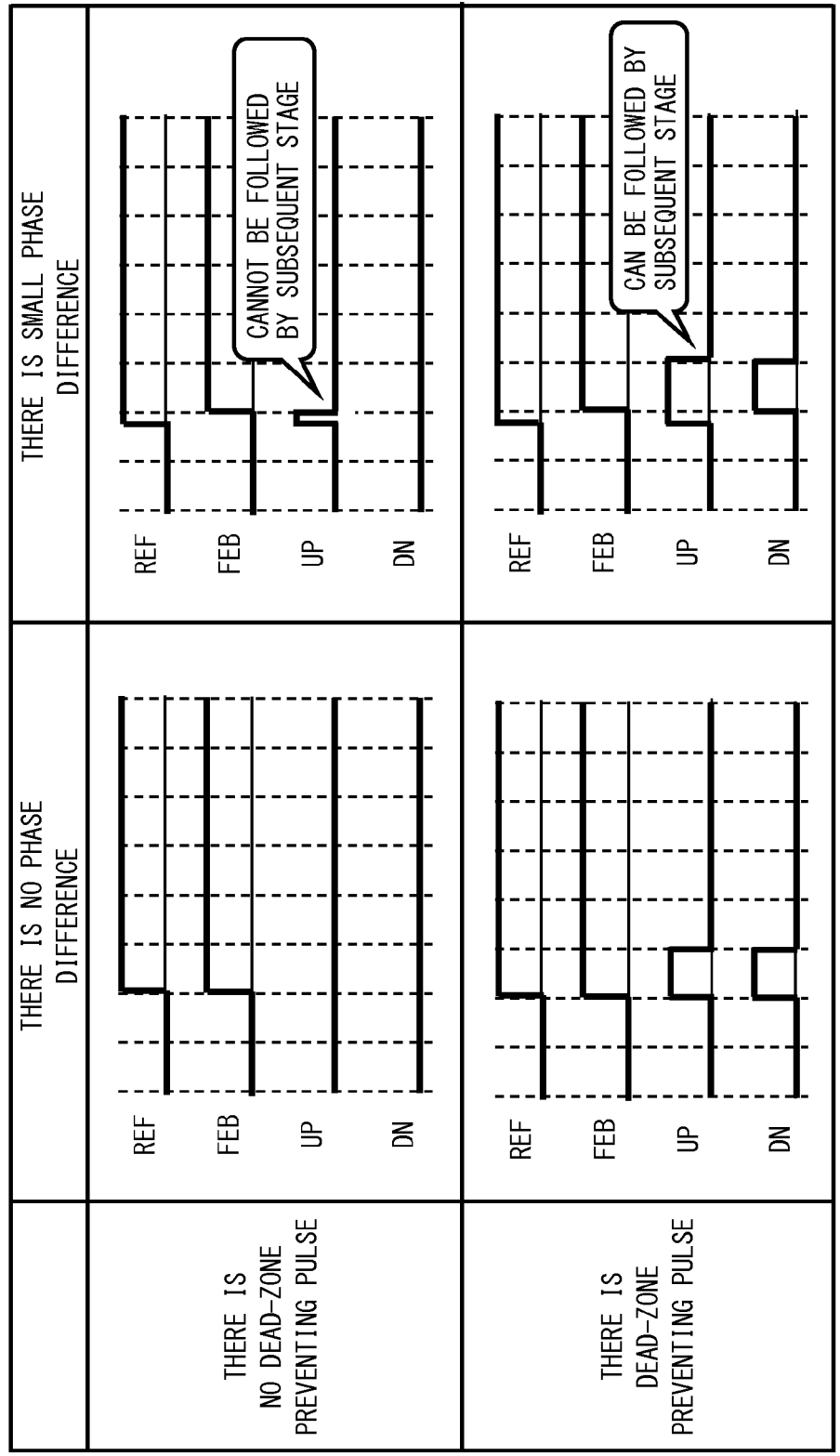
FIG. 15 is a timing diagram showing a difference between comparison results UP and DN of a phase comparator provided in the PLL circuit shown in FIG. 14, depending on the presence or absence of a dead-zone preventing pulse and the presence or absence of a phase difference.

FIG. 15 is a timing diagram showing a difference between the comparison results UP and DN of the phase comparator 51, depending on the presence or absence of the dead-zone preventing pulse and the presence or absence of the phase difference.

First, a case where the phase comparator 51 is configured to output the comparison results UP and DN without adding the dead-zone preventing pulse width will be described as a comparison example. When there is no phase difference between the reference signal REF and the feedback signal FEB, the phase comparator 51 outputs the comparison results UP and DN with no pulse width (see upper left in FIG. 15). When there is a small phase difference between the reference signal REF and the feedback signal FEB (a small phase difference<a minimum pulse width which can be detected by the charge pump 52), the phase comparator 51 outputs one (in this case, the comparison result UP) of the comparison results UP and DN having a pulse width corresponding to the small phase difference (upper right in FIG. 15). At this time, since the charge pump 52 cannot detect a pulse having a width corresponding to the small phase difference, the charge pump 52 cannot operate normally. As a result, the PLL circuit 50 cannot generate a highly accurate oscillating signal.

Next, a case where the phase comparator 51 is configured to output the comparison results UP and DN by adding the dead-zone preventing pulse width will be described. Even when there is no phase difference between the reference signal REF and the feedback signal FEB, the phase comparator 51 outputs the comparison results UP and DN having a pulse width (i.e., a dead-zone preventing pulse width) which is equal to or greater than a minimum pulse width which can be detected by the charge pump 52 (lower left in FIG. 15). When there is a small phase difference between the reference signal REF and the feedback signal FEB (a small phase difference<a minimum pulse width which can be detected by the charge pump 52), the phase comparator 51 outputs one (in this case, the comparison result UP) of the comparison results UP and DN having a pulse width obtained by adding the dead-zone preventing pulse width to the small phase difference, and outputs the other one of the comparison results UP and DN (in this case, the comparison result DN) having the dead-zone preventing pulse width (lower right in FIG. 15). Accordingly, even when the phase difference between the reference signal REF and the feedback signal FEB is smaller than the minimum pulse width, the charge pump 52 can operate normally by detecting the phase difference. As a result, the PLL circuit 50 can generate a highly accurate oscillating signal.

Figure 16:
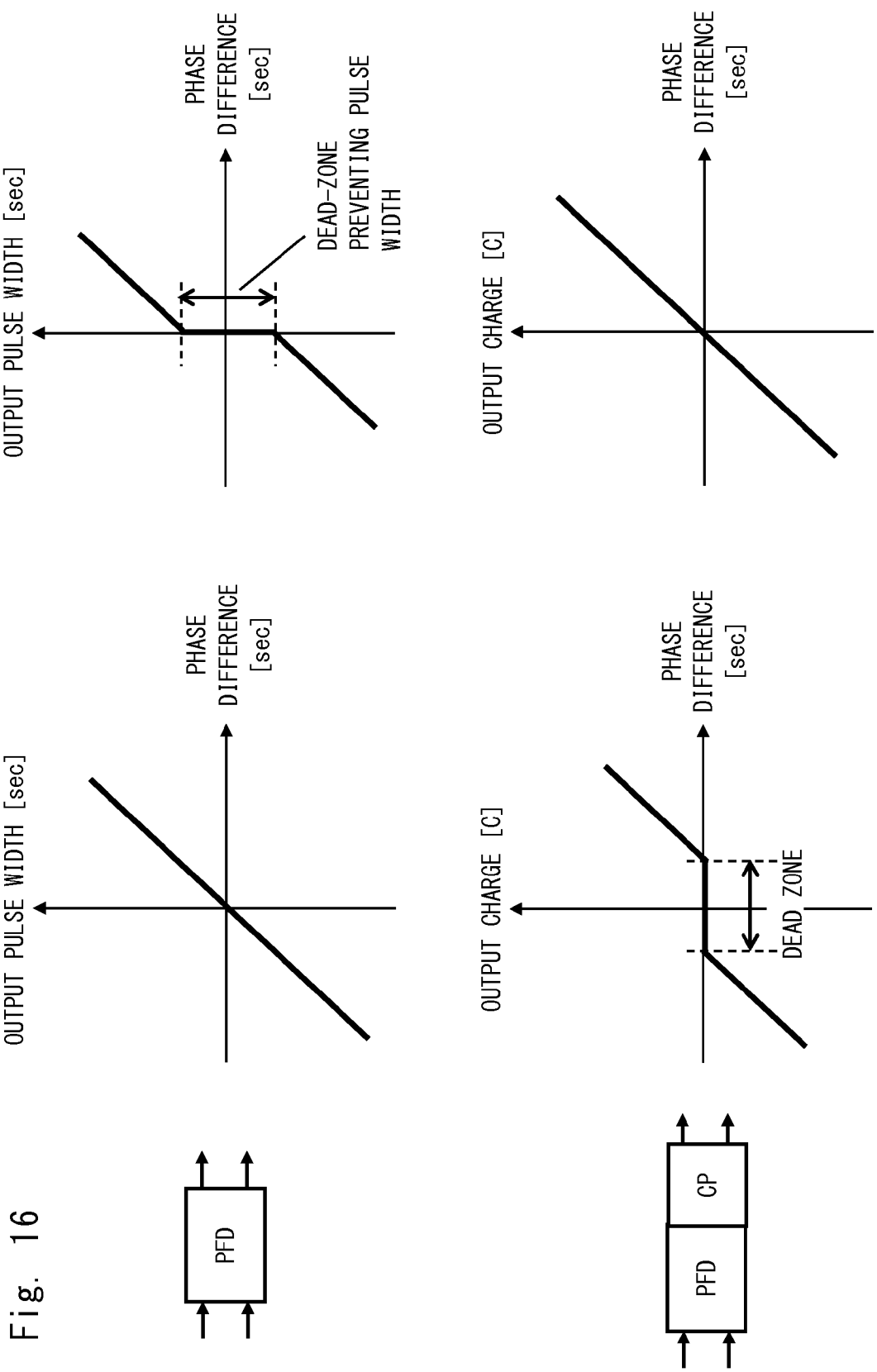
FIG. 16 is a diagram showing a difference in relationships among an input phase difference and an output pulse width of a phase comparator and an output charge of a charge pump, depending on the presence or absence of the dead-zone preventing pulse.

FIG. 16 is a diagram showing a difference in relationships among an input phase difference of the phase comparator 51, an output pulse width of the phase comparator 51, and an output charge of the charge pump 52, depending on the presence or absence of the dead-zone preventing pulse.

As shown in FIG. 16, in the configuration in which the phase comparator 51 outputs the comparison results UP and DN without adding the dead-zone preventing pulse width, the phase comparator 51 outputs the comparison results UP and DN having a pulse width proportional to the phase difference between the reference signal REF and the feedback signal FEB (upper left in FIG. 16). Accordingly, as the phase difference decreases, the pulse width of the comparison result UP or DN also decreases. Thus, when the pulse width of the comparison result UP or DN is smaller than a minimum pulse width which can be detected by charge pump 52, the subsequent-stage charge pump 52 cannot detect the pulse of the comparison result UP or DN (lower left in FIG. 16).

On the other hand, in the configuration in which the phase comparator 51 outputs the comparison results UP and DN by adding the dead-zone preventing pulse width, even when there is no phase difference between the reference signal REF and the feedback signal FEB, the phase comparator 51 outputs the comparison results UP and DN having a predetermined pulse width (dead-zone preventing pulse) (upper right in FIG. 16). When there is a phase difference between the reference signal REF and the feedback signal FEB, the phase comparator 51 outputs one of the comparison results UP and DN having a pulse width obtained by adding the dead-zone preventing pulse width to the phase difference between the reference signal REF and the feedback signal FEB, and outputs the other one of the comparison results UP and DN having the dead-zone preventing pulse width. Accordingly, even when the phase difference between the reference signal REF and the feedback signal FEB is smaller than the minimum pulse width, the charge pump 52 can operate normally by detecting the phase difference (lower right in FIG. 16).

For the reasons as described above, the phase comparator 51 outputs the comparison results UP and DN by adding the dead-zone preventing pulse width.

However, the on-period of each of the switches 523 and 524, which constitute the charge pump 52, increases in accordance with an increase in the pulse width of the comparison results UP and DN of the phase comparator 51 when the dead-zone preventing pulse width is added. Thus, if the current flowing through the on-state switches 523 and 524 varies, the effect of current variations becomes too large to ignore.

Figure 17:
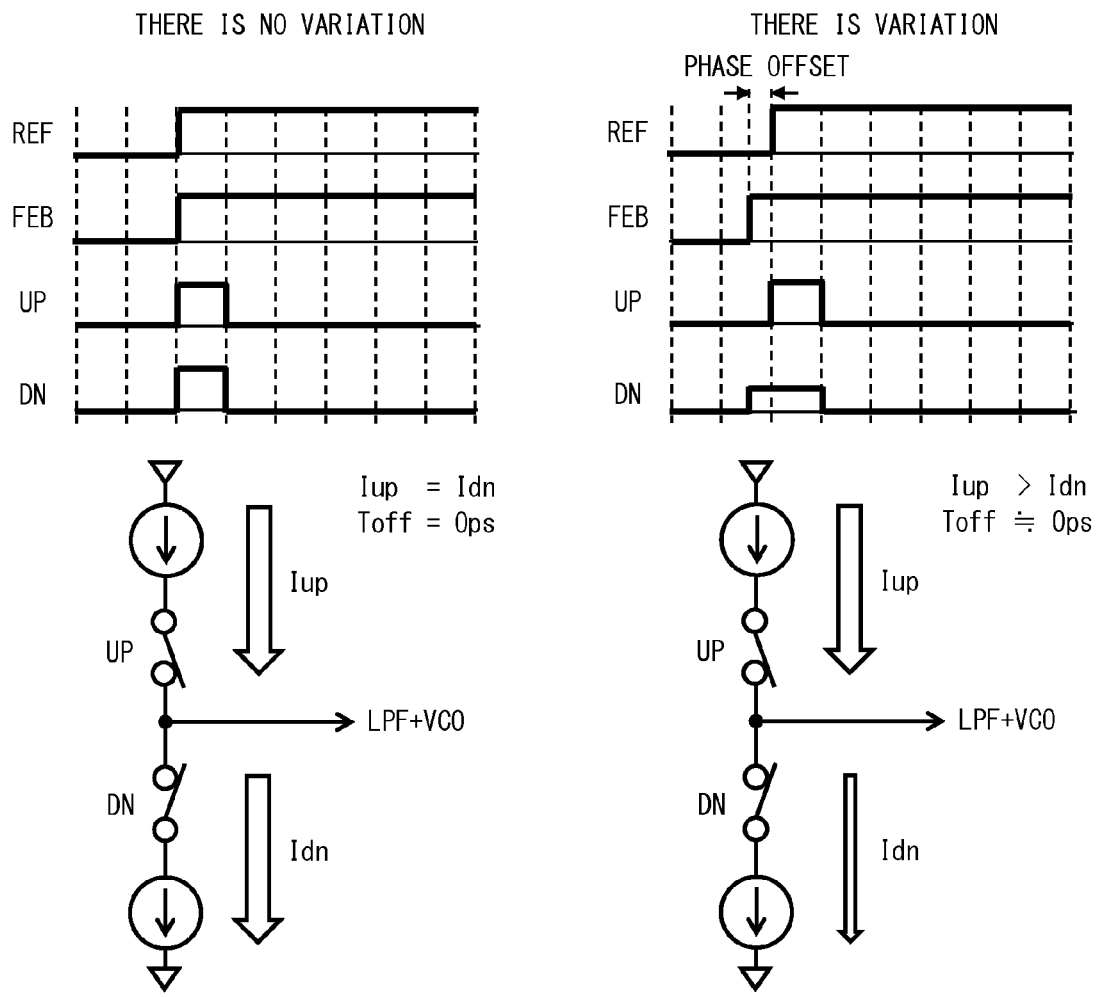
FIG. 17 is a timing diagram showing a difference in operation of a charge pump provided in the PLL circuit shown in FIG. 14, depending on the presence or absence of a current variation.

FIG. 17 is a timing diagram showing a difference in operation of the charge pump 52 depending on the presence or absence of a current variation.

As shown in FIG. 17, when there is no current variation, the on-periods of the switches 523 and 524, which constitute the charge pump 52, when the PLL circuit 50 is locked are the same (left in FIG. 17). On the other hand, when there is a current variation, the charge pump 52 changes the on-period of each of the switches 523 and 524, to thereby cancel out the variation in the current flowing through the switches 523 and 524 (right in FIG. 17). The difference between the on-period of the switch 523 and the on-period of the switch 524 corresponds to a phase offset. The term "phase offset" used herein refers to a steady phase difference between the reference signal REF and the feedback signal when the PLL circuit 50 is locked.

Thus, in the PLL circuit 50, the phase offset increases in accordance with an increase in the dead-zone preventing pulse width. On the other hand, when the dead-zone preventing pulse width is reduced so as to suppress the phase offset, the charge pump 52 cannot detect a pulse corresponding to a small phase difference.

In view of the above, the PLL circuit 1 according to an embodiment of the invention has been achieved.

Hereinafter, embodiments will be described with reference to the drawings. The drawings are made in a simplified manner, and therefore the technical scope of embodiments should not be narrowly interpreted based on the drawings. The same components are denoted by the same reference numerals, and repeated descriptions thereof are omitted.

In the following embodiments, explanations are made by referring to several sections or several embodiments for convenience, as required, but they are mutually related, and are in such a relation to each other that one of them is a modified example, an application example, a detailed explanation, a supplemental explanation, or the like of a part or all of the other, unless otherwise specified. Further, in the following embodiments, when a number of an element (including a number of items, numerical value, quantity, range, etc.) or the like is mentioned, the number is not limited to that specific number, and may be larger or smaller than the mentioned number, except for the case where it is explicitly indicated that the number should be the specifically-mentioned number or it is theoretically clear that the number should be limited to the specifically-mentioned number.

Further, in the following embodiments, the constituent elements thereof (including operation steps etc.) are not necessarily indispensable, except for the case where it is explicitly indicated that a specific element is indispensable, or it is theoretically clear that a specific element is indispensable. Similarly, in the following embodiments, when shapes, positional relationships, etc. of the constituent elements are mentioned, they include substantially similar or analogous shapes and so forth, except for the case where it is explicitly indicated, or it is theoretically clear that the above is not true. This also applies to the above-mentioned values (including a number of items, numerical value, quantity, range, etc.) and the like.

First Embodiment

Figure 1:
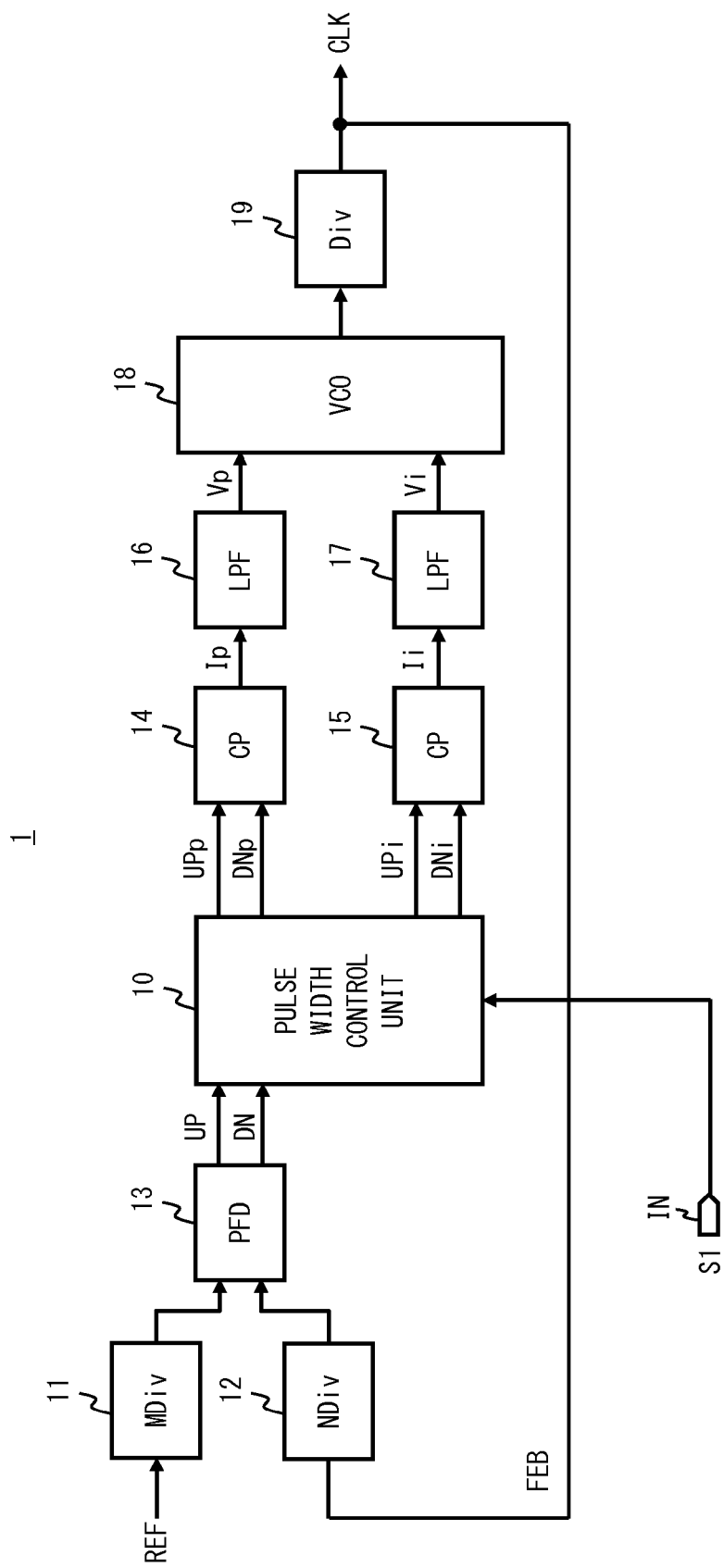
FIG. 1 is a block diagram showing a PLL circuit according to a first embodiment.

FIG. 1 is a block diagram showing the PLL circuit 1 according to a first embodiment. The PLL circuit 1 according to the first embodiment is a PLL circuit having a dual loop configuration including a proportional path and an integration path. The PLL circuit 1 adjusts a pulse width of a comparison result of a phase comparator so that the width of a pulse supplied to an integration-path-side charge pump is set to be smaller than the width of a pulse supplied to a proportional-path-side charge pump. Accordingly, the PLL circuit 1 according to the first embodiment can reduce the phase offset by suppressing the effect of current variations in the integration-path-side charge pump, while performing a fine adjustment of the phase difference in the proportional path. Further, the reduction in the phase offset leads to a reduction in jitter in an output of a voltage control oscillating circuit that is caused by the phase offset. As a result, the PLL circuit according to the first embodiment can generate a highly accurate oscillating signal. This will be described in detail below.

As shown in FIG. 1, the PLL circuit 1 includes a frequency divider (MDiv) 11, a frequency divider (NDiv) 12, a phase comparator (PFD) 13, a pulse width control unit 10, a charge pump (CP; first charge pump) 14, a charge pump (CP; second charge pump) 15, a filter (LPF; first filter) 16, a filter (LPF; second filter) 17, a voltage control oscillator (VCO) 18, and a frequency divider (Div).

(Frequency Dividers 11 and 12)

The frequency divider 11 divides the frequency of the reference signal REF, which is supplied from the outside of the PLL circuit 1, by M (M is a natural number), and outputs the frequency-divided signal. The frequency divider 12 divides the frequency of the feedback signal FEB, which is supplied from the voltage control oscillator 18, by N (N is a natural number), and outputs the frequency-divided signal.

(Phase Comparator 13)

The phase comparator 13 compares the phase of the reference signal REF whose frequency has been divided by M with the phase of the feedback signal FEB whose frequency has been divided by N, and outputs comparison results (reference comparison result) UP and DN obtained by adding a dead-zone preventing pulse width.

Figure 2:
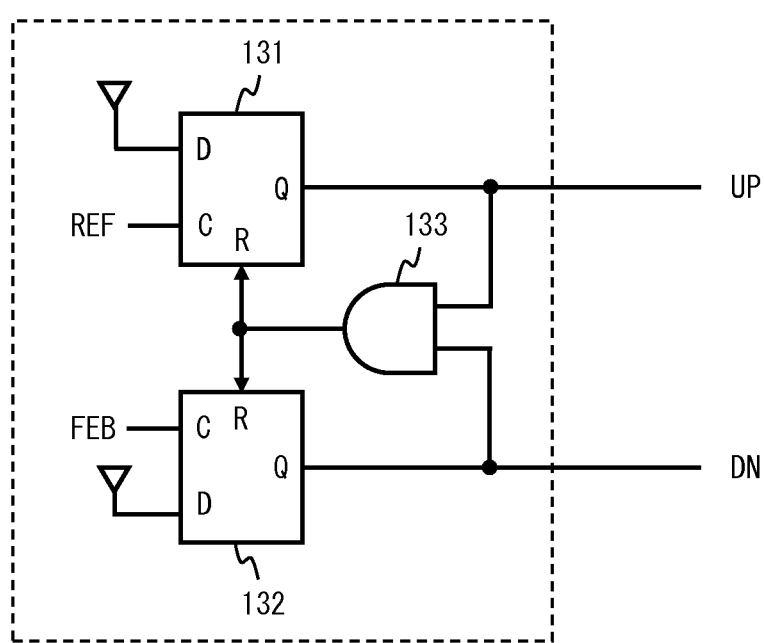
FIG. 2 is a circuit diagram showing a specific configuration of a phase comparator provided in the PLL circuit shown in FIG. 1.

FIG. 2 is a circuit diagram showing an example of a specific configuration of the phase comparator 13.

As shown in FIG. 2, the phase comparator 13 includes flip-flops 131 and 132 and an AND circuit 133.

In the flip-flop 131, an H-level fixed signal is input to a data input terminal D; the reference signal REF whose frequency has been divided by M is input to a clock terminal C; an output of the AND circuit 133 is input to a reset terminal R; and the comparison result UP is output from an output terminal Q.

In the flip-flop 132, an H-level fixed signal is input to the data input terminal D; the feedback signal REF whose frequency has been divided by N is input to the clock terminal C; an output of the AND circuit 133 is input to the reset terminal R; and the comparison result DN is output from the output terminal Q.

The AND circuit 133 outputs the logical AND of the comparison results UP and DN to the flip-flops 131 and 132.

The flip-flop 131 causes the comparison result UP to rise in synchronization with a rising edge of the reference signal REF. The flip-flop 132 causes the comparison result DN to rise in synchronization with a rising edge of the feedback signal FEB. When both the comparison results UP and DN rise, the AND circuit 133 causes the output to rise. This allows the flip-flops 132 and 133 to be initialized, so that both the comparison results UP and DN fall.

For example, when there is no phase difference between the reference signal REF and the feedback signal FEB, the phase comparator 13 outputs the comparison results UP and DN having the same pulse width. On the other hand, when there is a phase difference between the reference signal REF and the feedback signal FEB, the phase comparator 13 outputs the comparison results UP and DN having different pulse widths. More specifically, when the phase of the feedback signal FEB lags behind the phase of the reference signal REF, the pulse width of the comparison result UP is set to be longer than the pulse width of the comparison result DN. When the phase of the feedback signal FEB is ahead of the phase of the reference signal REF, the pulse width of the comparison result DN is set to be longer than the pulse width of the comparison result UP.

The configuration of the phase comparator 13 is not limited to the above configuration and can be changed as needed to other configurations having the same functions.

(Pulse Width Control Unit 10)

The pulse width control unit 10 adjusts the pulse widths of the comparison results UP and DN of the phase comparator 13, and outputs comparison results (first comparison result) UPp and DNp and comparison results (second comparison result) UPi and DNi. The comparison results UPp and DNp are supplied to a proportional-path-side charge pump 14, and the comparison results UPi and DNi are supplied to an integration-path-side charge pump 15.

Figure 3:
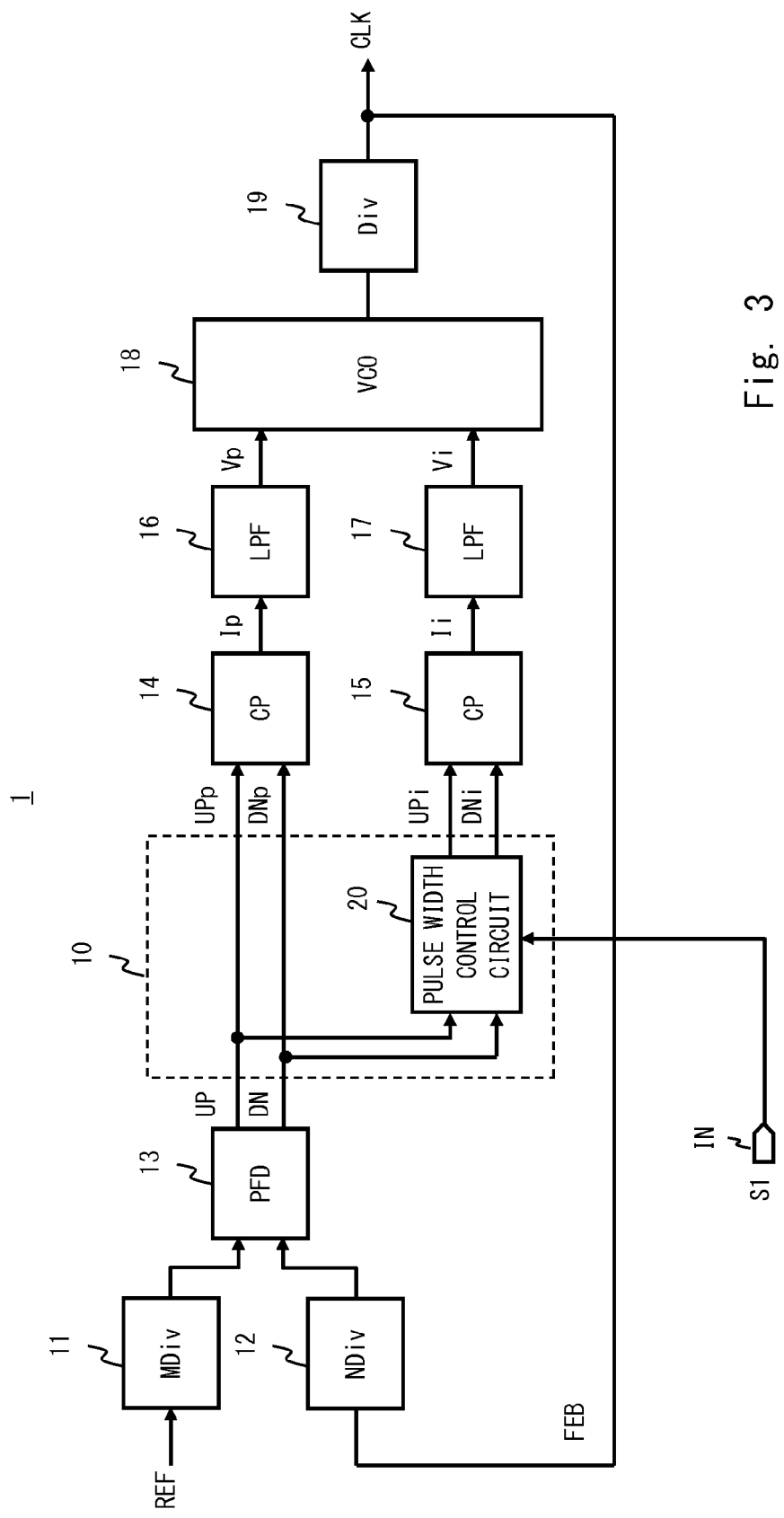
FIG. 3 is a block diagram showing a specific configuration of the PLL circuit shown in FIG. 1.

FIG. 3 is a block diagram showing the PLL circuit 1 in which the pulse width control unit 10 is specifically illustrated.

As shown in FIG. 3, the pulse width control unit 10 includes a pulse width control circuit 20 which is located in the integration path. For example, when a control signal (external control signal) S1 supplied from the outside through an input terminal IN is at an L level, the pulse width control circuit 20 outputs the comparison results UPi and DNi without changing the pulse width of the comparison results UP and DN. When the control signal S1 at an H level, the pulse width control circuit 20 outputs the comparison results UPi and DNi by reducing the pulse width of the comparison results UP and DN by a predetermined width (first predetermined width). Further, the pulse width control unit 10 directly outputs the comparison results UP and DN as the comparison results UPp and DNp. Hereinafter, assume that the pulse width control unit 10 has a configuration shown in FIG. 3.

When the PLL circuit 1 is used for an application with a narrow tolerance to the phase offset, for example, when the PLL circuit 1 is used for skew adjustment of communication data, the H-level control signal S1 is input to the pulse width control unit 10. When the PLL circuit 1 is used for an application with a wide tolerance to the phase offset, for example, when the PLL circuit 1 is used for the main clock of a CPU, the L-level control signal S1 is input to the pulse width control unit 10.

The first embodiment illustrates a case where the pulse width control circuit 20 selects, based on the control signal S1, the comparison results UP and DN, or comparison results obtained by reducing the pulse width of the comparison results UP and DN by a predetermined width, and outputs the selected comparison results as the comparison results UPi and DNi. However, the configuration of the pulse width control circuit 20 is not limited to this. The configuration of the pulse width control circuit 20 can be changed as needed to a configuration in which the pulse width control circuit 20 outputs the comparison results UPi and DNi by reducing the pulse width of the comparison results UP and DN by a predetermined width.

Figure 4:
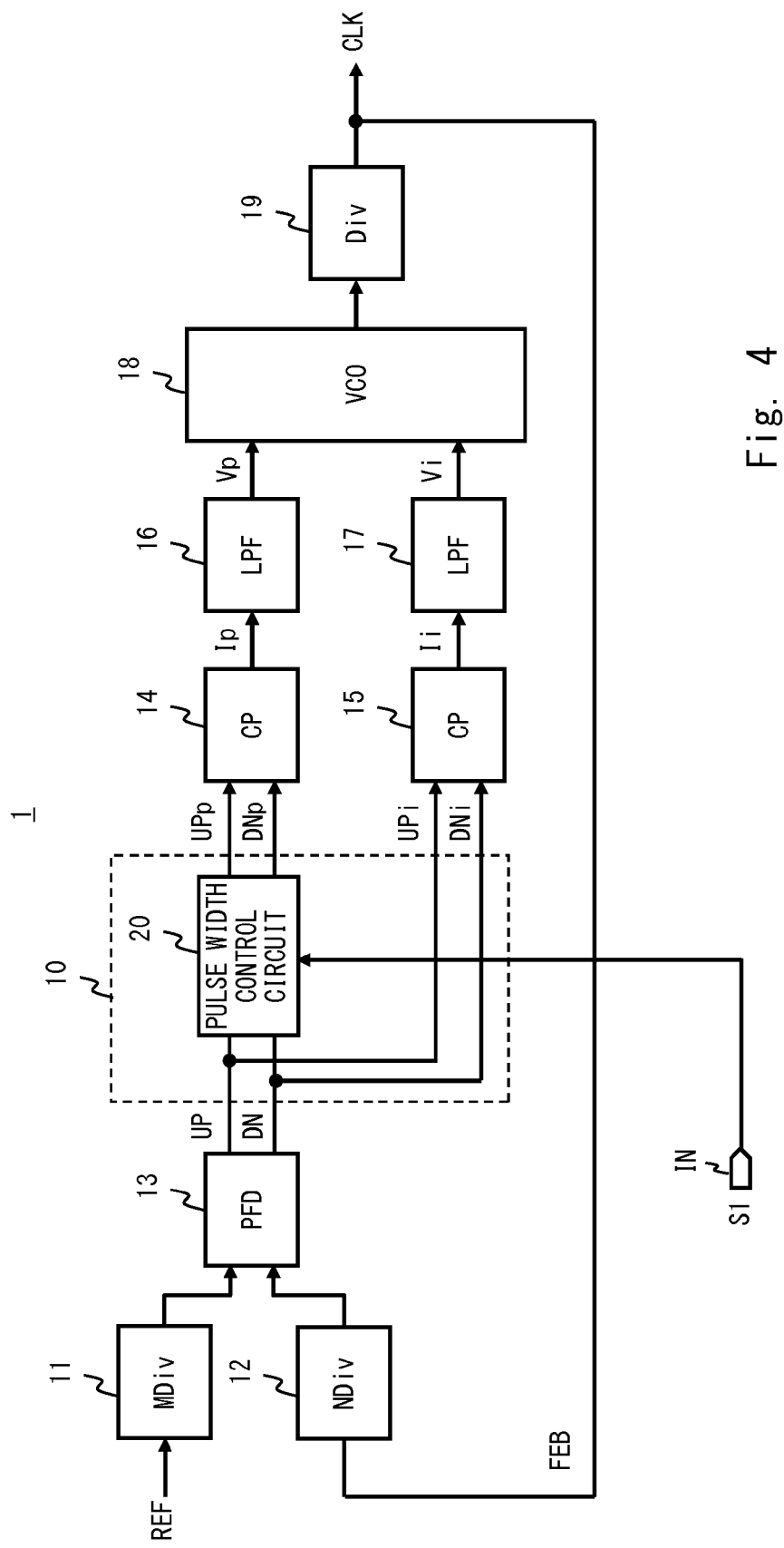
FIG. 4 is a block diagram showing a modified example of the PLL circuit shown in FIG. 1.

While the first embodiment illustrates a case where the pulse width control circuit 20 is provided in the integration path, the configuration of the pulse width control circuit 20 is not limited to this. As shown in FIG. 4, the configuration of the control circuit 20 can be changed as needed to a configuration in which the pulse width control circuit 20 is provided in the proportional path and the pulse width control circuit 20 can output the comparison results UPp and DNp by increasing the pulse width of the comparison results UP and DN of the phase comparator 13 by a predetermined width.

(A Specific Configuration of the Pulse Width Control Circuit 20)

Figure 5:
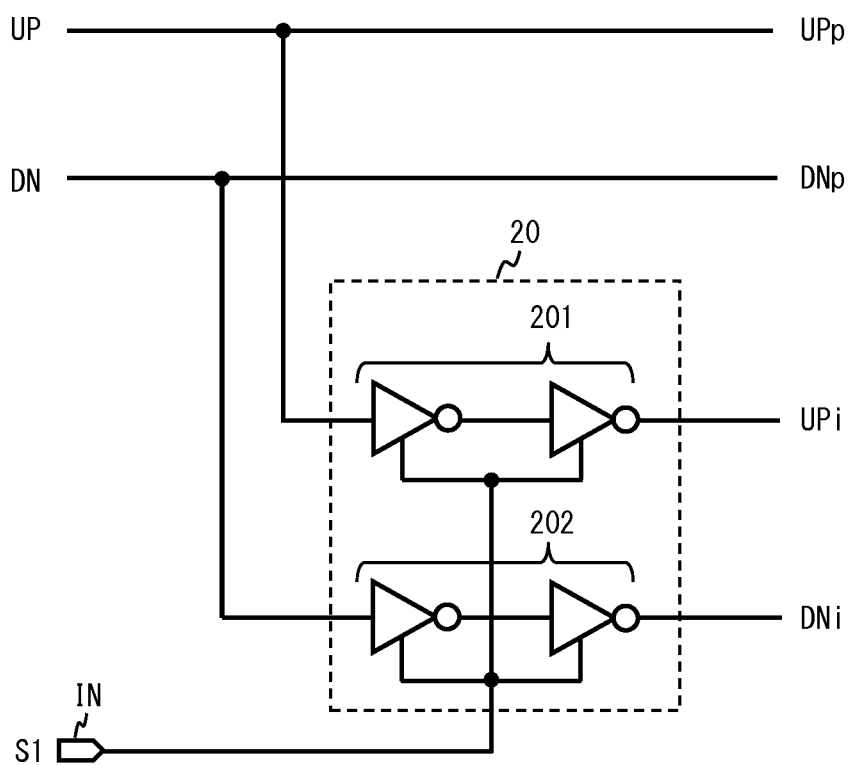
FIG. 5 is a circuit diagram showing a specific configuration of a pulse width control circuit provided in the PLL circuit shown in FIG. 3.

FIG. 5 is a circuit diagram showing an example of a specific configuration of the pulse width control circuit 20.

As shown in FIG. 5, the pulse width control circuit 20 can be achieved with a simple circuit configuration, and includes an inverter group 201 and an inverter group 202. In the example shown in FIG. 5, the number of inverters that constitute each of the inverter groups 201 and 202 is two (even number).

For example, when the control signal S1 is at the L level, the inverter group 201 delays a rising edge and a falling edge of the comparison result UP by the same amount of delay, and outputs the comparison result as the comparison result UPi. The inverter group 202 delays a rising edge and a falling edge of the comparison result DN by the same amount of delay, and outputs the comparison result as the comparison result DNi. On the other hand, when the control signal S1 is at the H level, the inverter group 201 delays a rising edge of the comparison result UP more than a falling edge of the comparison result UP, and outputs the comparison result as the comparison result UPi. The inverter group 202 delays a rising edge of the comparison result DN more than a falling edge of the comparison result DN, and outputs the comparison result as the comparison result DNi.

Thus, when the control signal S1 is at the L level, the pulse width control circuit 20 can output the comparison results UPi and DNi without changing the pulse width of the comparison results UP and DN, and when the control signal S1 is at the H level, the pulse width control circuit 20 can output the comparison results UPi and DNi by reducing the pulse width of the comparison results UP and DN by a predetermined width.

The configuration of the pulse width control circuit 20 is not limited to the above configuration and can be changed as needed to other configurations having the same functions. Another configuration example of the pulse width control circuit 20 will be described below.

(A Modified Example of the Pulse Width Control Circuit 20)

Figure 6:
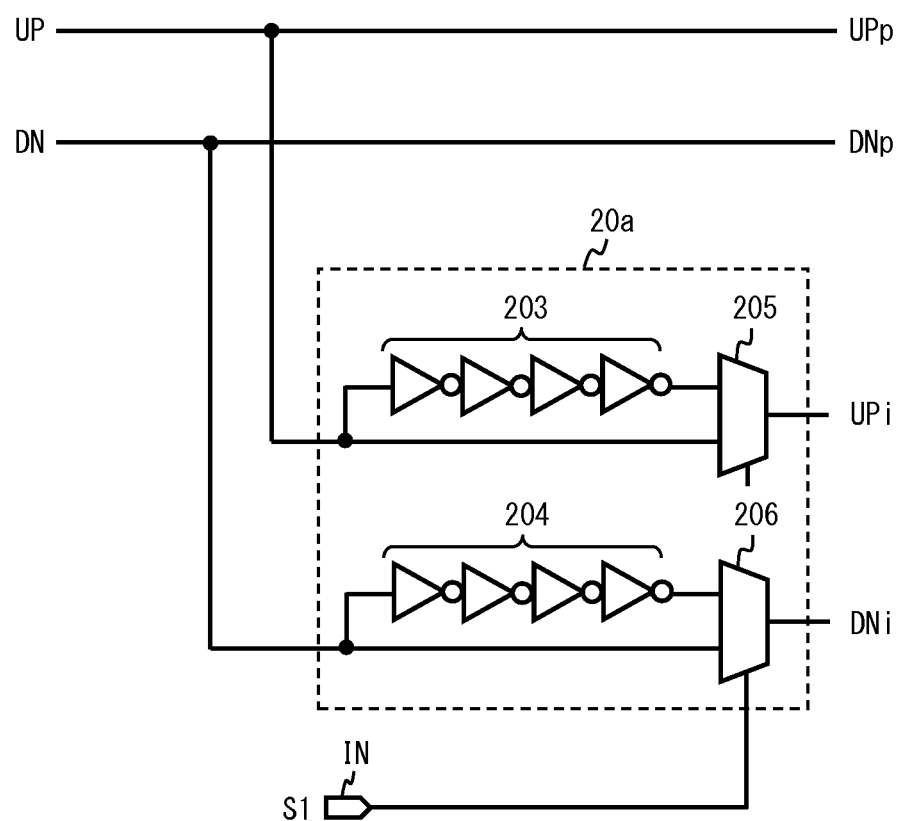
FIG. 6 is a circuit diagram showing a modified example of the pulse width control circuit provided in the PLL circuit shown in FIG. 3.

FIG. 6 is a circuit diagram showing a pulse width control circuit 20a as a modified example of the pulse width control circuit 20.

As shown in FIG. 6, the pulse width control circuit 20a includes an inverter group 203, an inverter group 204, a selector 205, and a selector 206.

The inverter group 203 delays a rising edge of the comparison result UP more than a falling edge of the comparison result UP, and outputs the comparison result UP. The inverter group 204 delays a rising edge of the comparison result DN more than a falling edge of the comparison result DN, and outputs the comparison result DN. The selector 205 selects one of the output of the inverter group 203 and the comparison result UP based on the control signal S1, and outputs the selected result as the comparison result UPi. The selector 206 selects one of the output of the inverter group 204 and the comparison result DN based on the control signal S1, and outputs the selected result as the comparison result DNi.

Accordingly, when the control signal S1 is at the L level, the pulse width control circuit 20 can output the comparison results UPi and DNi without changing the pulse width of the comparison results UP and DN, and when the control signal S1 is at the H level, the pulse width control circuit 20 can output the comparison results UPi and DNi by reducing the pulse width of the comparison results UP and DN by a predetermined width.

(Charge Pump 14)

The proportional-path-side charge pump 14 is a circuit that generates a current (first current) Ip according to the comparison results UPp and DNp of the phase comparator 13.

Figure 7:
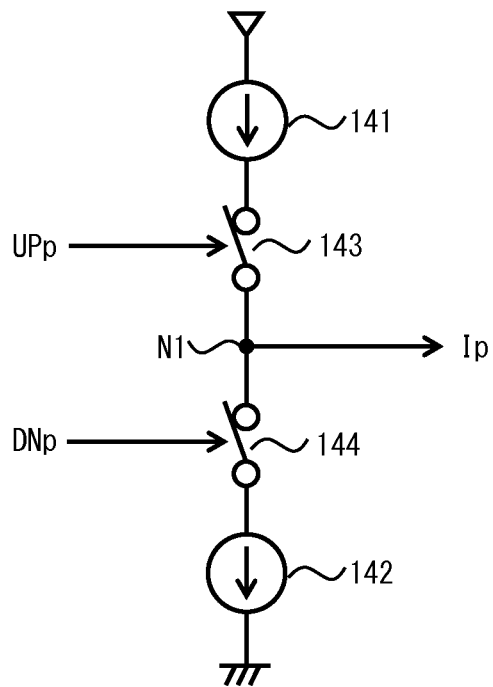
FIG. 7 is a circuit diagram showing a specific configuration of a proportional-path-side charge pump provided in the PLL circuit shown in FIG. 1.

FIG. 7 is a circuit diagram showing an example of a specific configuration of the charge pump 14.

As shown in FIG. 7, the charge pump 14 includes constant current sources 141 and 142 and switches 143 and 144. The switches 143 and 144 are, for example, N-channel type MOS transistors.

The constant current source 141 is provided on the side of the power supply voltage terminal VDD. The switch 143 is provided between the constant current source 141 and an output node N1, and turns on and off based on the comparison result UPp. The constant current source 142 is provided on the side of the ground voltage terminal GND. The switch 144 is provided between the constant current source 142 and the output node N1, and turns on and off based on the comparison result DNp.

For example, when the pulse width of the comparison result UPp and the pulse width of the comparison result DNp are the same, the switches 143 and 144 turn on for the same period of time, and thus the charge pump 14 does not generate the current Ip. On the other hand, when the pulse width of the comparison result UPp and the pulse width of the comparison result DNp are different, the on-period of the switch 143 and the on-period of the switch 144 are different, and thus the charge pump 14 generates the current Ip. More specifically, when the pulse width of the comparison result UPp is longer than the pulse width of the comparison result DNp, the charge pump 14 accumulates the charge in the filter 16 during a period corresponding to the difference between the pulse widths (i.e., the phase difference). When the pulse width of the comparison result DNp is longer than the pulse width of the comparison result UPp, the charge pump 14 discharges the charge accumulated in the filter 16 for a period corresponding to the difference between the pulse widths (i.e., the phase difference).

The configuration of the charge pump 14 is not limited to the above configuration and can be changed as needed to other configurations having the same functions.

(Filter 16)

The proportional-path-side filter 16 is a so-called low-pass filter. The filter 16 generates a control voltage (first control voltage) Vp by removing a high-frequency component of a voltage generated based on the current Ip output from the charge pump 14.

Figure 8:
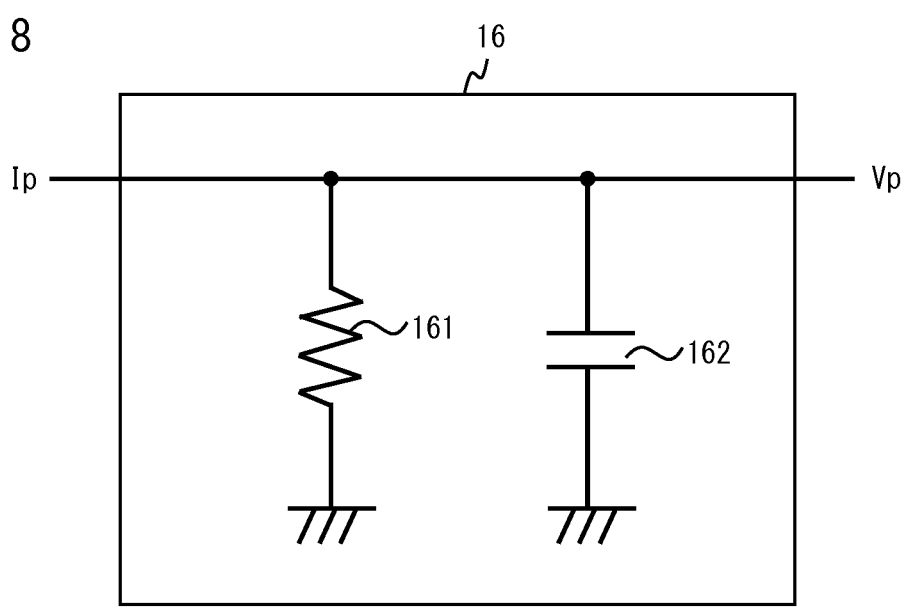
FIG. 8 is a circuit diagram showing a specific configuration of a proportional-path-side filter provided in the PLL circuit shown in FIG. 1.

FIG. 8 is a circuit diagram showing an example of a specific configuration of the filter 16.

As shown in FIG. 8, the filter 16 includes a resistor element 161 and a capacitor element 162. The resistor element 161 and the capacitor element 162 are provided in parallel between the output terminal of the charge pump 14 and the ground voltage terminal GND. The configuration of the filter 16 is not limited to the above configuration and can be changed as needed to other configurations having the same functions.

According to this configuration, in the proportional path, the control voltage Vp which is proportional to the phase difference indicated by the comparison results UPp and DNp is generated.

(Charge Pump 15)

The integration-path-side charge pump 15 is a circuit that generates a current (second current) Ii according to the comparison results UPi and DNi as the output of the pulse width control circuit 20.

Figure 9:
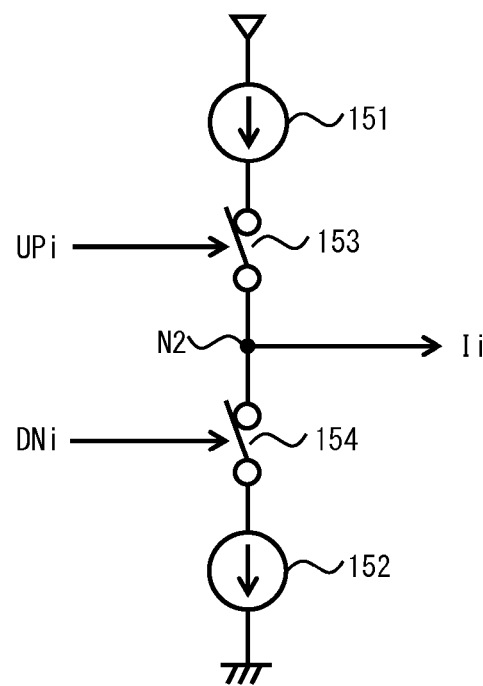
FIG. 9 is a circuit diagram showing a specific configuration of an integration-path-side charge pump provided in the PLL circuit shown in FIG. 1.

FIG. 9 is a circuit diagram showing an example of a specific configuration of the charge pump 15.

As shown in FIG. 9, the charge pump 15 includes constant current sources 151 and 152 and switches 153 and 154. The constant current sources 151 and 152 and the switches 153 and 154 correspond to the constant current sources 141 and 142 and the switches 143 and 144, respectively, in the charge pump 14. The details of the charge pump 15 are the same as those of the charge pump 14, and thus the descriptions thereof are omitted.

The configuration of the charge pump 15 is not limited to the above configuration and can be changed as needed to other configurations having the same functions.

(Filter 17)

The integration-path-side filter 17 is a circuit that outputs the integration result of the current Ii, which is generated by the charge pump 15, as a control voltage (second control voltage) Vi.

Figure 10:
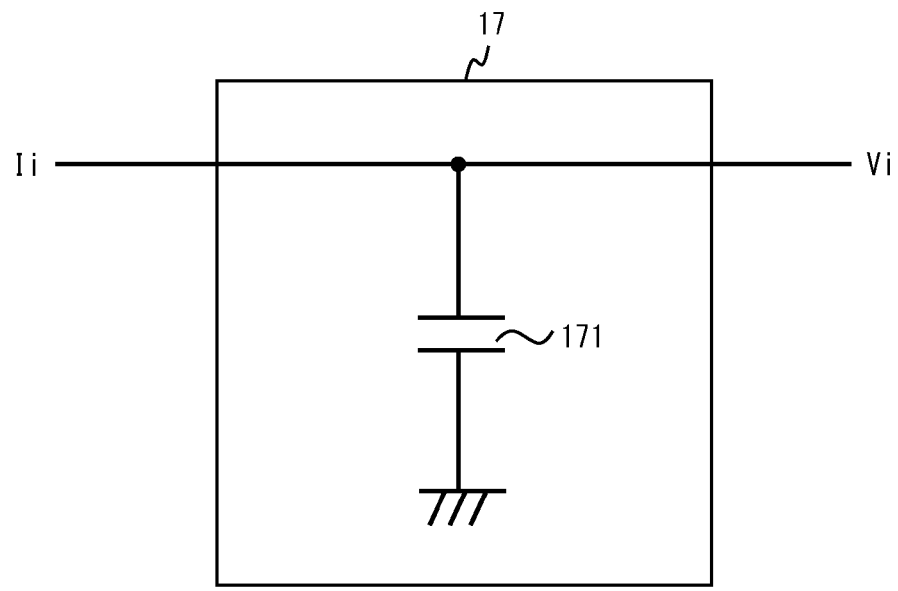
FIG. 10 is a circuit diagram showing a specific configuration of an integration-path-side filter provided in the PLL circuit shown in FIG. 1.

FIG. 10 is a circuit diagram showing an example of a specific configuration of the filter 17.

As shown in FIG. 10, the filter 17 includes a capacitor element 171 which is provided between the output terminal of the charge pump 15 and the ground voltage terminal GND.

In the filter 17, the charge of the current Ii is accumulated in the capacitor element 171, or the charge of the current Ii is discharged from the capacitor element 171. A voltage according to the charge accumulated in the capacitor element 171 is output as the control voltage Vi.

According to this configuration, in the integration path, a result obtained by integrating a current according to the comparison results UPi and DNi is generated as the control voltage Vi.

(Voltage Control Oscillator 18)

The voltage control oscillator 18 outputs an oscillating signal having a frequency according to the control voltages Vp and Vi. For example, the voltage control oscillator 18 increases the frequency of the oscillating signal as the control voltages Vp and Vi increase, and the voltage control oscillator 18 decreases the frequency of the oscillating signal as the control voltages Vp and Vi decrease.

(Frequency Divider 19)

The frequency divider 19 divides the frequency of the oscillating signal output from the voltage control oscillator 18, and outputs the frequency-divided signal as the clock signal CLK. The clock signal CLK is also used as the feedback signal FEB.

Note that it is not necessary to provide the frequency dividers 11, 12, and 19. The whole or part of the frequency dividers may be omitted depending on the intended use of the PLL circuit 1. For example, when the frequency divider 19 is omitted, the output of the voltage control oscillator 18 is directly used as the clock signal CLK and the feedback signal FEB.

(Operation of the PLL Circuit 1)

Next, the operation of the PLL circuit 1 will be described.

In the PLL circuit 1, the frequency divider 11 divides the frequency of the reference signal REF, and the frequency divider 12 divides the frequency of the feedback signal FEB. The phase comparator 13 compares the phase of the output of the frequency divider 11 with the phase of the output of the frequency divider 12, and outputs the comparison results UP and DN. The pulse width control unit 10 adjusts the pulse widths of the comparison results UP and DN, and outputs the comparison results UPp and DNp and the comparison results UPi and DNi.

In the proportional path, the charge pump 14 outputs the current Ip according to the difference between the pulse width of the comparison result UPp and the pulse width of the comparison result DNp. The filter 16 removes a high-frequency component of a voltage generated based on the current Ip, and outputs the control voltage Vp.

In the integration path, the charge pump 15 outputs the current Ii according to the difference between the pulse width of the comparison result UPi and the pulse width of the comparison result DNi. The filter 17 outputs a result obtained by integrating the current Ii as the control voltage Vi.

The voltage control oscillator 18 generates an oscillating signal having a frequency according to the control voltages Vp and Vi. The frequency divider 19 divides the frequency of the oscillating signal and outputs the frequency-divided signal as the clock signal CLK. The clock signal CLK is also used as the feedback signal FEB.

For example, when the phase of the feedback signal FEB (clock signal CLK) lags behind the phase of the reference signal REF, the PLL circuit 1 increases the frequency of the clock signal CLK, and when the phase of the feedback signal FEB is ahead of the phase of the reference signal REF, the PLL circuit 1 decreases the frequency of the clock signal CLK. Thus, the PLL circuit 1 matches the phases of the reference signal REF and the feedback signal FEB.

For example, assuming that the frequency of each of the reference signal REF and the feedback signal FEB is 100 MHz and the frequency division ratios of the frequency dividers 11, 12, and 19 are 1, 10, and 1, respectively, the oscillation frequency of the voltage control oscillator 18 is 1 GHz.

In this case, the proportional path does not have a charge holding function, and thus performs a fine adjustment of the phase difference every time the phase comparator 13 performs the comparison operation. The integration path has the charge holding function and holds frequency information. Accordingly, the phase offset may occur mainly due to variations in the current of the charge pump 15 provided in the integration path having the charge holding function (more specifically, variations in the current flowing through the switches 153 and 154 that constitute the charge pump 15). In other words, the phase offset can be reduced by improving the uniformity of the current in the integration-path-side charge pump 15.

For example, when the control signal S1 is at the H level, the pulse width control unit 10 adjusts the pulse widths of the comparison results UP and DN, and outputs the comparison results UPp and DNp and the comparison results UPi and DNi having a pulse width smaller than that of the comparison results UPp and DNp.

Figure 11:
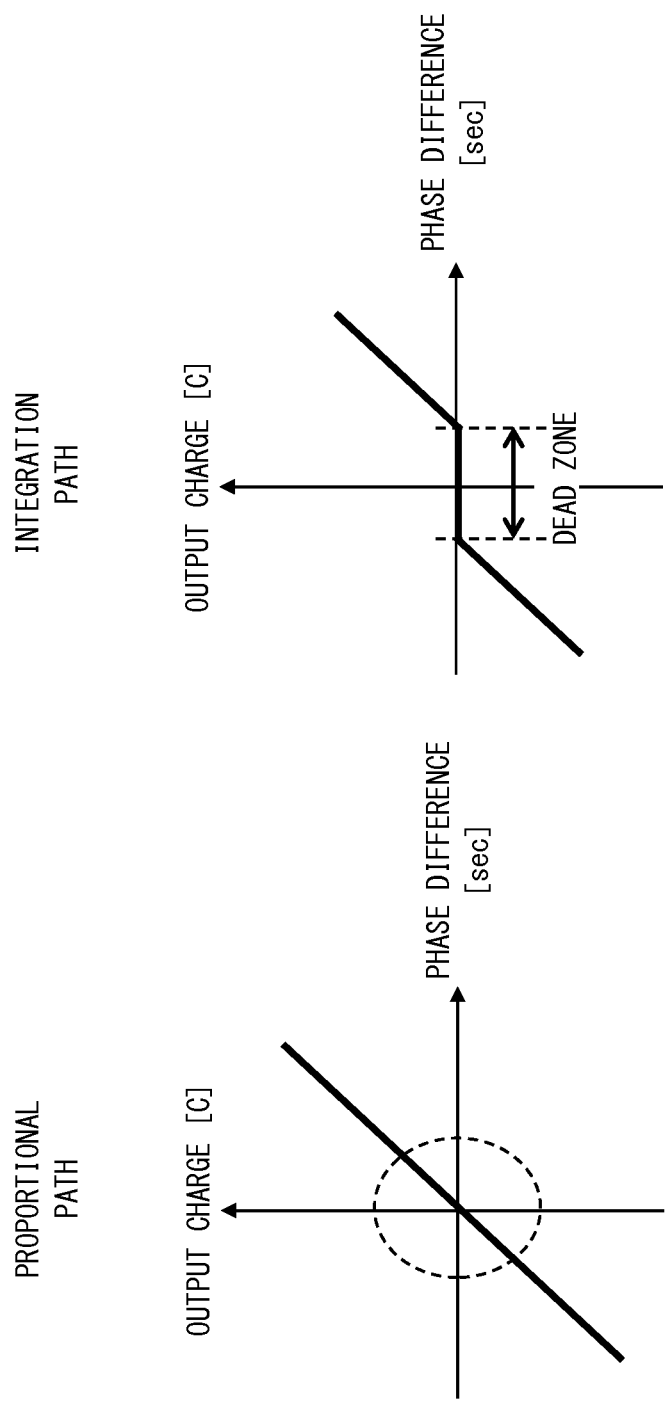
FIG. 11 is a graph showing relationships between an input phase difference of a phase comparator, which is provided in the PLL circuit shown in FIG. 1, and output charges of the proportional-path-side charge pump and integration-path-side charge pump which are provided in the PLL circuit shown in FIG. 1.

At this time, the dead-zone preventing pulse width of the comparison results UPp and DNp is adjusted so that the dead-zone preventing pulse width is equal to or greater than a minimum pulse width which can be detected by the charge pump 14. Thus, the proportional-path-side charge pump 14 can perform the phase adjustment normally by detecting the phase difference even when the phase difference between the reference signal REF and the feedback signal FEB is smaller than the minimum pulse width (see the left part in FIG. 11).

On the other hand, the dead-zone preventing pulse width of the comparison results UPi and DNi is adjusted so that the dead-zone preventing pulse width is smaller than, for example, a minimum pulse width which can be detected by the charge pump 15. Accordingly, the pulse width of the comparison results UPi and DNi may be smaller than a minimum pulse width which can be detected by the charge pump 15. For this reason, when the pulse width of the comparison results UPi and DNi is smaller than a minimum pulse width which can be detected by the charge pump 15, the integration-path-side charge pump 15 cannot detect the comparison results UPi and DNi (see the right part in FIG. 11). However, during this period, no current flows through the switches 153 and 154 that constitute the charge pump 15, so that no current variation occurs in the charge pump 15. As a result, the phase offset is eliminated. When the phase offset is eliminated, jitter in the output of the voltage control oscillator 18 that is caused by the phase offset is not generated. Note that it is necessary to appropriately adjust the dead-zone preventing pulse width while preventing the noise sensitivity from being excessively increased.

Thus, the PLL circuit 1 can reduce the phase offset by suppressing the effect of current variations in the integration-path-side charge pump 15, while performing a fine adjustment of the phase difference in the proportional path. Further, the reduction in the phase offset leads to a reduction in jitter in the output of the voltage control oscillator 18 that is caused by the phase offset.

Note that in the integration-path-side charge pump 15, switching between a non-sensing operation, which is performed when the PLL circuit is locked, and a sensing operation, which is performed when, for example, jitter occurs, is performed continuously and automatically. This eliminates the need for a special control operation.

Thus, the PLL circuit 1 can generate a highly accurate oscillating signal that satisfies strict phase adjustment requirements. Meanwhile, when strict phase adjustment requirements are not imposed, the tolerance to the phase offset and jitter increases, which leads to a further reduction in the area and power consumption of the PLL circuit 1.

It is not necessary that the dead-zone preventing pulse width of the comparison results UPi and DNi be smaller than a minimum pulse width which can be detected by the charge pump 15. It is only necessary that the dead-zone preventing pulse width of the comparison results UPi and DNi be smaller than at least the dead-zone preventing pulse width of the comparison results UPp and DNp. Accordingly, a period in which errors in the current flowing through the switches 153 and 154 constituting the integration-path-side charge pump 15 are produced can be reduced. Consequently, the phase offset can be reduced by suppressing the effect of variations in the current flowing through the switches 153 and 154.

Thus, the PLL circuit 1 adjusts the pulse widths of the comparison results of the phase comparator so that the width of a pulse supplied to the integration-path-side charge pump 15 is set to be smaller than the width of a pulse supplied to the proportional-path-side charge pump 14. Note that the width of the dead-zone preventing pulse supplied to the proportional-path-side charge pump 14 is set to be equal to or greater than a minimum pulse width which can be detected by the charge pump 14. Accordingly, the PLL circuit 1 can reduce the phase offset by suppressing the effect of current variations in the integration-path-side charge pump 15, while performing a fine adjustment of the phase difference in the proportional path. Further, the reduction in the phase offset leads to a reduction in jitter in the output of the voltage control oscillator 18 that is caused by the phase offset. As a result, the PLL circuit 1 can generate a highly accurate oscillating signal.

Since the PLL circuit 1 has a dual loop configuration, the size of each capacitor element provided in the filters 16 and 17 can be substantially reduced in comparison to the single loop configuration. As a result, the PLL circuit 1 can achieve a reduction in area.

Furthermore, the PLL circuit 1 suppresses current variations in the charge pump 15 by using the pulse width control circuit 20, which eliminates the need for the charge pump 15 to be provided with a function to suppress current variations. In other words, the configuration of the charge pump 15 can be simplified. As a result, the PLL circuit 1 can achieve a reduction in power consumption.

In sum, the PLL circuit 1 can achieve a reduction in area, a reduction in power consumption, a reduction in offset, and a reduction in jitter.

Second Embodiment

Figure 12:
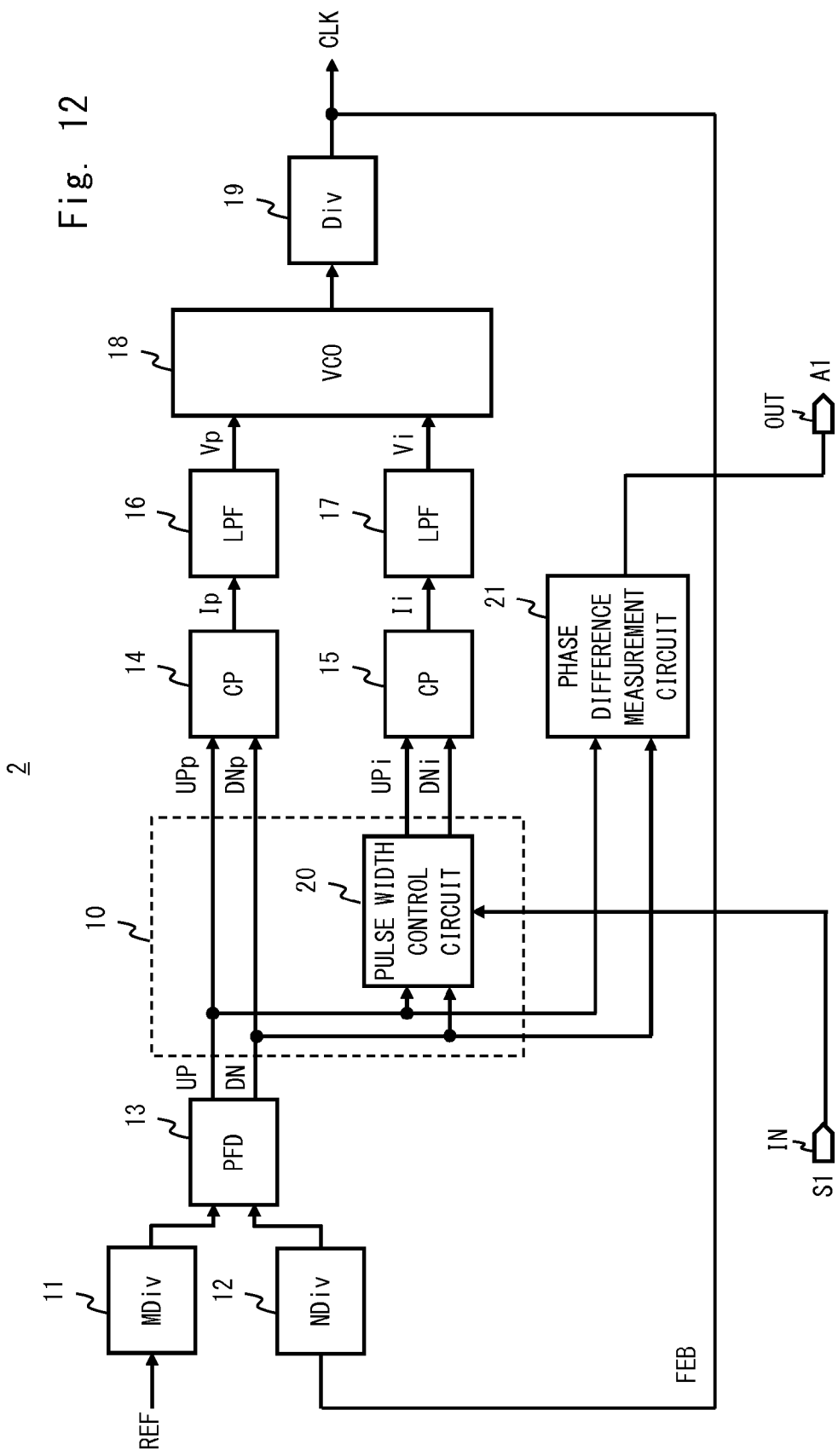
FIG. 12 is a block diagram showing a PLL circuit according to a second embodiment.

FIG. 12 is a block diagram showing a PLL circuit 2 according to a second embodiment. The PLL circuit 2 has a function of testing as to whether the phase offset of the PLL circuit 2 is equal to or lower than a prescribed value.

As shown in FIG. 12, the PLL circuit 2 differs from the PLL circuit 1 in that the PLL circuit 2 further includes a phase difference measurement circuit 21. Further, the pulse width control circuit 20 provided in the PLL circuit 2 selects, based on the control signal S1, the comparison results UP and DN, comparison results obtained by reducing the pulse width of the comparison results UP and DN, or comparison results obtained by increasing the pulse width of the comparison results UP and DN, and outputs the selected comparison results as the comparison results UPi and DNi. The other components of the PLL circuit 2 are the same as those of the PLL circuit 1, and thus the descriptions thereof are omitted.

During a test, the pulse width control circuit 20 outputs the comparison results UPi and DNi by increasing the pulse width (dead-zone preventing pulse width) of the comparison results UP and DN by a predetermined width (second predetermined width). In this case, the phase offset is proportional to the dead-zone preventing pulse width. Specifically, if the dead-zone preventing pulse width is doubled, the phase offset is also doubled. Accordingly, the measurement of the phase offset can be facilitated by increasing the dead-zone preventing pulse width.

The phase difference measurement circuit 21 is a circuit that measures the phase offset based on the comparison results UP and DN of the phase comparator 13.

The phase difference measurement circuit 21 is, for example, a flip-flop. A data input terminal and a clock input terminal of the flip-flop are supplied with the comparison results UP and DN, respectively. If the phase offset obtained when the dead-zone preventing pulse width is increased is small, a rising edge of the comparison result UP is close to a rising edge of the comparison result DN. Accordingly, the flip-flop alternately outputs logical values 0 and 1 (left in FIG. 13). On the other hand, if the phase offset obtained when the dead-zone preventing pulse width is increased is large, a rising edge of the comparison result UP is sufficiently away from a rising edge of the comparison result DN. Accordingly, the flip-flop continuously outputs the logical value 1 (right in FIG. 13). Therefore, observing the output value of the flip-flop, for example, when the dead-zone preventing pulse width is increased by a certain width, makes it possible to determine whether the phase offset is equal to or smaller than a prescribed value.

The second embodiment illustrates a case where the pulse width control circuit 20 selects any of the comparison results UP and DN, comparison results obtained by reducing the pulse width of the comparison results UP and DN, and comparison results obtained by increasing the pulse width of the comparison results UP and DN, based on the control signal S1, and outputs the selected comparison results as the comparison results UPi and DNi. However, the configuration of the pulse width control circuit 20 is not limited to this. The pulse width control circuit 20 may be configured to select, based on the control signal S1, the comparison results UP and DN, or comparison results obtained by increasing the pulse width of the comparison results UP and DN, and to output the selected comparison results as the comparison results UPi and DNi. Alternatively, the pulse width control circuit 20 may be configured to select, based on the control signal S1, comparison results obtained by reducing the pulse width of the comparison results UP and DN, or comparison results obtained by increasing the pulse width of the comparison results UP and DN, and to output the selected comparison results as the comparison results UPi and DNi.

While the second embodiment illustrates a case where the phase difference measurement circuit 21 is provided in the PLL circuit 2, the configuration of the phase difference measurement circuit 21 is not limited to this. The phase difference measurement circuit 21 may be provided on the outside of the PLL circuit 2.

(Differences Between the Present Invention and Related Art)

The configuration disclosed in the specification of U.S. Pat. No. 7,511,543 B2 requires a highly accurate detection circuit for detecting a difference in pulse width between an up signal and a down signal. Further, as described above, in the configuration disclosed in the specification of U.S. Pat. No. 7,511,543 B2, the difference between the width of the up signal and the width of the down signal is detected by a replica of a phase comparator. Accordingly, the phase offset cannot be effectively reduced due to the effect of relative variations between the phase comparator and the replica thereof. Even if the difference between the width of the up signal and the width of the down signal can be detected, the phase offset cannot be sufficiently reduced because the output current of the charge pump is adjusted for each current control unit.

On the other hand, the PLL circuit 1 reduces the width of the dead-zone preventing pulse supplied to the integration-path-side charge pump 15 to reduce the period in which errors in the current flowing through the switches 153 and 154 constituting the charge pump 15 are produced, thereby suppressing current variations in the charge pump 15 that affect the phase offset. This eliminates the need for the PLL circuit 1 to be provided with the highly accurate detection circuit and the replica of the phase comparator. Moreover, the PLL circuit 1 sets the width of the dead-zone preventing pulse supplied to the integration-path-side charge pump 15 to be smaller than a minimum pulse width which can be detected by the charge pump 15, thereby making it possible to reduce the phase offset to substantially 0.

Although the invention made by the present inventor has been described in detail above with reference to embodiments, the present invention is not limited to the embodiments described above and can be modified in various manners without departing from the scope of the invention.

For example, in the semiconductor device according to the embodiments described above, the conductivity type (p-type or n-type) of the semiconductor substrate, semiconductor layer, diffusion layer (diffusion region), and the like may be reversed. Accordingly, when one of the conductivity types of the n-type and the p-type is defined as a first conductivity type and the other conductivity type is defined as a second conductivity type, the first conductivity type may be the p-type and the second conductivity type may be the n-type. On the contrary, the first conductivity type may be the n-type and the second conductivity type may be the p-type.

The whole or part of the embodiments disclosed above can be described as, but not limited to, the following supplementary notes.

(Supplementary Note 1)

A PLL circuit comprising:

a phase comparator that compares a phase of a reference signal with a phase of a feedback signal, and outputs a first comparison result;

a pulse width control unit that selectively outputs the first comparison result and a second comparison result based on an external control signal, the second comparison result being a comparison result obtained by increasing a pulse width of the first comparison result by a second predetermined width;

a first charge pump that outputs a first current according to the first comparison result;

a second charge pump that outputs a second current according to the second comparison result;

a first filter that removes a high-frequency component of a voltage generated based on the first current, and outputs a first control voltage;

a second filter that outputs, as a second control voltage, a result obtained by integrating the second current; and an oscillator that generates an oscillating signal having a frequency according to the first and second control voltages, and feeds the oscillating signal back to the phase comparator as the feedback signal.

(Supplementary Note 2)

The PLL circuit according to Supplementary note 1, wherein the pulse width control circuit selectively outputs, as the second comparison result, the first comparison result and the comparison result obtained by increasing the pulse width of the first comparison result by the second predetermined width, as well as a comparison result obtained by reducing the pulse width of the first comparison result by a first predetermined width, based on the external control signal.

(Supplementary Note 3)

A test method of a PLL circuit, comprising:

comparing a phase of a reference signal with a phase of a feedback signal, and outputting a reference comparison result;

adjusting a pulse width of the reference comparison result, and outputting first and second comparison results;

outputting a first current according to the first comparison result;

outputting a second current according to the second comparison result;

removing a high-frequency component of a voltage generated based on the first current, and outputting a first control voltage;

outputting, as a second control voltage, a result obtained by integrating the second current;

generating an oscillating signal having a frequency according to the first and second control voltages, and using the oscillating signal as the feedback signal; and outputting the second comparison result by increasing a pulse width of the second comparison result by a predetermined width, and measuring a phase difference between the reference signal and the feedback signal when the PLL circuit is locked.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A phase locked loop (PLL) circuit comprising:
a phase comparator that compares a phase of a reference signal with a phase of a feedback signal and outputs a reference comparison result;
a pulse width control unit that adjusts a pulse width of the reference comparison result, and outputs a first comparison result and a second comparison result having a pulse width smaller than that of the first comparison result;
a first charge pump that outputs a first current according to the first comparison result;
a second charge pump that outputs a second current according to the second comparison result;
a first filter that removes a high-frequency component of a voltage generated based on the first current, and outputs a first control voltage;
a second filter that outputs, as a second control voltage, a result obtained by integrating the second current; and
an oscillator that generates an oscillating signal having a frequency according to the first and second control voltages, and feeds the oscillating signal back to the phase comparator as the feedback signal.

2. The PLL circuit according to claim 1, wherein
the pulse width control unit includes a pulse width control circuit that outputs, as the second comparison result, a comparison result obtained by reducing the pulse width of the reference comparison result by a first predetermined width, and
the pulse width control unit outputs the reference comparison result as the first comparison result.

3. The PLL circuit according to claim 2, wherein the pulse width control circuit selectively outputs, as the second comparison result, the reference comparison result and the comparison result obtained by reducing the pulse width of the reference comparison result by the first predetermined width, based on an external control signal.

4. The PLL circuit according to claim 2, wherein the pulse width control circuit selectively outputs, as the second comparison result, the comparison result obtained by reducing the pulse width of the reference comparison result by the first predetermined width, and a comparison result obtained by increasing the pulse width of the reference comparison result by a second predetermined width, based on an external control signal.

5. The PLL circuit according to claim 3, wherein the pulse width control circuit selectively outputs, as the second comparison result, the reference comparison result, the comparison result obtained by reducing the pulse width of the reference comparison result by the first predetermined width, and a comparison result obtained by increasing the pulse width of the reference comparison result by a second predetermined width, based on the external control signal.

6. A phase locked loop (PLL) circuit performing a control method, comprising:
comparing a phase of a reference signal with a phase of a feedback signal and outputting a reference comparison result;
adjusting a pulse width of the reference comparison result and outputting a first comparison result and a second comparison result having a pulse width smaller than that of the first comparison result;
outputting a first current according to the first comparison result;
outputting a second current according to the second comparison result;
removing a high-frequency component of a voltage generated based on the first current, and outputting a first control voltage;
outputting, as a second control voltage, a result obtained by integrating the second current; and
generating an oscillating signal having a frequency according to the first and second control voltages, and using the oscillating signal as the feedback signal.

7. The control method of a PLL circuit according to claim 6, wherein
the reference comparison result is output as the first comparison result, and a comparison result obtained by reducing the pulse width of the reference comparison result by a first predetermined width is output as the second comparison result.

8. The control method of a PLL circuit according to claim 7, wherein the second comparison result is output by increasing the pulse width of the reference comparison result by a second predetermined width, and a phase difference between the reference signal and the feedback signal when the PLL circuit is locked is measured.

* * * * *